(12) United States Patent
Huli (10) Patent No.: US 9,791,779 B2
(45) Date of Patent: Oct. 17, 2017

(54) EUV RESIST ETCH DURABILITY IMPROVEMENT AND PATTERN COLLAPSE MITIGATION

(71) Applicant: Tokyo Electron Limited, Minato-ku, Tokyo (JP)

(72) Inventor: Lior Huli, Delmar, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/882,626

(22) Filed: Oct. 14, 2015

(65) Prior Publication Data

US 2016/0109804 A1   Apr. 21, 2016

Related U.S. Application Data

(60) Provisional application No. 62/064,636, filed on Oct. 16, 2014.

(51) Int. Cl.
| | |
|---|---|
| *G03F 7/26* | (2006.01) |
| *G03F 7/40* | (2006.01) |
| *H01L 21/027* | (2006.01) |
| *H01L 21/033* | (2006.01) |

(Continued)

(52) U.S. Cl.
CPC .............. *G03F 7/40* (2013.01); *G03F 7/0035* (2013.01); *G03F 7/32* (2013.01); *H01L 21/0271* (2013.01);
(Continued)

(58) Field of Classification Search
CPC .................................. G03F 7/0035; G03F 7/26
See application file for complete search history.

(56) References Cited

U.S. PATENT DOCUMENTS

| 2008/0261125 A1 | 10/2008 | Hishiro |
| 2012/0208125 A1 | 8/2012 | Hatakeyama |

(Continued)

FOREIGN PATENT DOCUMENTS

| JP | 2008-066467 A | 3/2008 |
| JP | 2008-139827 A | 6/2008 |

(Continued)

OTHER PUBLICATIONS

Japan Patent Office, Office Action issued in related Patent Application No. JP2015-203573 dated Oct. 4, 2016, 15 pp., including English translation.

(Continued)

*Primary Examiner* — Kathleen Duda
(74) *Attorney, Agent, or Firm* — Wood Herron & Evans LLP (57) ABSTRACT

A method for patterning a substrate is described. The patterning method includes receiving a first patterned layer overlying a material layer to be etched on a substrate, wherein the first patterned layer is composed of a resist material having (i) material properties that provide lithographic resolution of less than about 40 nanometers when exposed to extreme ultraviolet radiation lithography, and (ii) material properties that provide a nominal etch resistance to an etch process condition. The first patterned layer is overcoated with an image reversal material such that the image reversal material fills and covers the first patterned layer. The patterning method further includes removing an upper portion of the image reversal material such that top surfaces of the first patterned layer are exposed, and removing the first patterned layer such that the image reversal material remains resulting in a second patterned layer.

21 Claims, 6 Drawing Sheets

(51) Int. Cl.
G03F 7/00 (2006.01)
G03F 7/32 (2006.01)
(52) U.S. Cl.
CPC ...... H01L 21/0274 (2013.01); H01L 21/0337 (2013.01)

(56) References Cited

U.S. PATENT DOCUMENTS

| | | |
|---|---|---|
| 2012/0329282 A1 | 12/2012 | Chang |
| 2013/0273741 A1 | 10/2013 | Yamamoto |
| 2014/0234781 A1 | 8/2014 | Hatakeyama et al. |
| 2015/0132965 A1 | 5/2015 | deVilliers et al. |
| 2016/0011516 A1 | 1/2016 | deVilliers |

FOREIGN PATENT DOCUMENTS

| | | |
|---|---|---|
| JP | 2010267880 A | 11/2010 |
| JP | 2010-286618 A | 12/2010 |
| JP | 2012-185485 A | 9/2012 |
| JP | 2013-137512 A | 7/2013 |
| JP | 2013-218191 A | 10/2013 |
| TW | 201235787 A | 9/2012 |
| TW | 201241555 A | 10/2012 |

OTHER PUBLICATIONS

Machine translation of JP2010-286618, 91 pp, printed Oct. 25, 2016.
Machine translation of JP2013-218191, 22 pp, printed Oct. 25, 2016.
European Patent Application No. 15190137.8, "European Search Report," European filing date Oct. 16, 2015, European Search report dated Feb. 19, 2016.
Dennis Shu-Hao Hsu, et al., "A Novel Double Patterning Approach for 30nm Dense Holes," 2011, Proc. of SPIE vol. 7972, pp. 79720D-1-79720D-10, Nanya Technology Corporation, New Taipei City 243, Taiwan, R.O.C.
David J. Abdallah, et al., "Image Reversal Trilayer Materials and Processing," 2009, Proc. of SPIE vol. 7520, pp. 75200L-1-75200L-12, AZ Electronic Materials, 70 Meister Avenue, Somerville, NJ 08876, US; AZ Electroni Materials, Kakegawa-shi, Shizuoka, Japan.
F. C. M. J. M. van Delft, et al., "Reversing the hydrogen silsesquioxane image by silicon nitride and silicon oxide chemical mechanical polishing," Dec. 4, 2006, J. Vac. Sci. Technol. B, vol. 24, American Vacuum Societ, pp. 3125-3127.
Korean Intellectual Property Office, Office Action issued in corresponding KR Patent Application No. 10-2015-0144798 dated Jul. 13, 2016, 16 pp., including English translation.
Korean Intellectual Property Office, Office Action issued in Patent Application No. 10-2015-0144798 dated May 30, 2017, 8 pp., including English translation.
Japan Patent Office, Office Action issued in Patent Application No. JP2015-203573 dated Apr. 18, 2017, 13 pp., including English translation.
Taiwan Intellectual Property Office, Notification of Examination Opinion issued in counterpart Taiwan Application No. 104133957 dated Nov. 11, 2016, 19 pp., including English translation.

EUV RESIST ETCH DURABILITY IMPROVEMENT AND PATTERN COLLAPSE MITIGATION

Pursuant to 37 C.F.R. §1.78(a)(4), this application claims the benefit of and priority to prior filed Provisional Application Ser. No. 62/064,636, filed on Oct. 16, 2014, which is expressly incorporated herein by reference.

FIELD OF INVENTION

The invention relates to a method for patterning a thin film on a substrate.

DESCRIPTION OF RELATED ART

In material processing methodologies, pattern etching comprises the application of a layer of radiation-sensitive material, such as photo-resist, to an upper surface of a substrate, the formation of a pattern in the layer of radiation-sensitive material using photo-lithography, and the transfer of the pattern formed in the layer of radiation-sensitive material to an underlying thin film on the substrate using an etching process. The patterning of the radiation-sensitive material generally involves exposure of the radiation-sensitive material to a pattern of electromagnetic (EM) radiation using, for example, a photo-lithography system, followed by the removal of the irradiated regions of the radiation-sensitive material (as in the case of positive tone resist), or non-irradiated regions (as in the case of negative tone resist) using a developing solution.

More recently, EUV (extreme ultraviolet) photo-lithography is a candidate for enabling next generation devices using cost friendly processes. Two critical problems that have become difficult to control in sub 22 nm half-pitch patterns is pattern collapse and the ability to provide an EUV resist layer of sufficient etch resistance and thickness to transfer the resist feature pattern using an etch process to the underlying layer. The increase of aspect ratio that comes from further scaling promotes the onset of pattern collapse. The aspect ratio relates the height of the feature pattern to the critical dimension (CD) or width of the feature pattern.

One solution to overcome pattern collapse is to reduce the resist thickness to achieve lower aspect ratio. The reduction of the resist thickness to achieve a lower aspect ratio limits the ability to fully transfer the resist feature pattern into the underlying layer(s) by the etch process due to the relatively low etch resistance of EUV resists. Therefore, other solutions are required to overcome the limitations of EUV photo-lithography, and achieve non-collapsible sub-22 nm half-pitch patterns with sufficient etch resistance for subsequent etch steps.

SUMMARY OF THE INVENTION

The invention relates to a method for patterning a thin film on a substrate. The invention further relates to improving the etch resistance of EUV resists, and mitigating pattern collapse of EUV resist patterns.

According to one embodiment, a method for patterning a substrate is described. The patterning method includes receiving a first patterned layer overlying a material layer to be etched on a substrate, wherein the first patterned layer is composed of a resist material having (i) material properties that provide lithographic resolution of less than about 40 nanometers when exposed to extreme ultraviolet (EUV) radiation lithography, and (ii) material properties that provide a nominal etch resistance to an etch process condition selected to etch the material underlying the first patterned layer. The first patterned layer is over-coated with an image reversal material such that the image reversal material fills and covers the first patterned layer, wherein the image reversal material has material properties that provide an etch resistance to the etch process condition that exceeds the nominal etch resistance. The patterning method further includes removing an upper portion of the image reversal material such that top surfaces of the first patterned layer are exposed, and removing the first patterned layer such that the image reversal material remains resulting in a second patterned layer.

DETAILED DESCRIPTION OF SEVERAL EMBODIMENTS

A method for patterning a substrate is disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features which, notwithstanding the inventive nature of the general concepts being explained, are also of an inventive nature.

"Substrate" as used herein generically refers to the object being processed in accordance with embodiments of the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

Figure 1A:
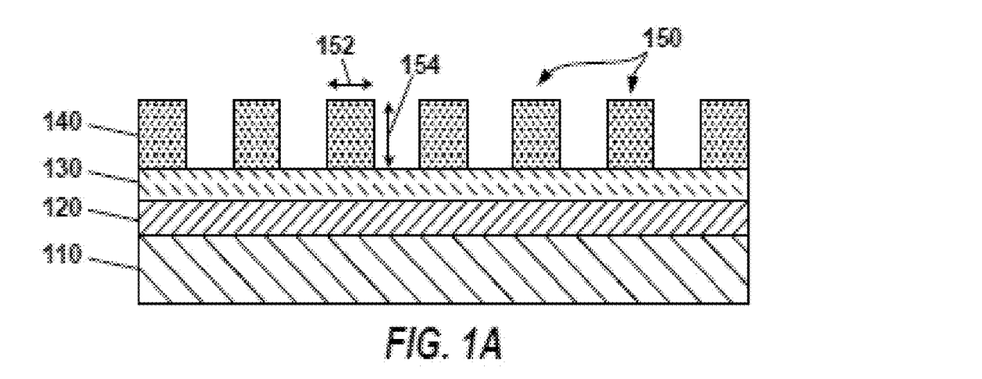
FIGS. 1A through 1G present a simplified schematic representation of a method of patterning a substrate according to an embodiment.

According to one embodiment, a patterning method is described that provides a pathway to enable low aspect ratio feature patterns with sufficient etch resistance for subsequent etch transfer processes. The method uses an intermediate material that replaces the original resist feature with a new high etch resistance film before the etch process. FIGS. 1 and 2, together with FIG. 3, illustrate exemplary process sequences for reversing the pattern one or more times to improve etch resistance and reduce the probability for pattern collapse. The material used for reversing the pattern has an increased etch resistance to the etch process that selectively removes the underlying layer. Therefore, the feature CD can be fully transferred into the underlying layer. Various embodiments for patterning a thin film described herein enable further shrinking of the device by lowering the resist thicknesses that are needed to overcome collapse effects at high aspect ratios. Techniques include using reversal materials and/or reversal techniques, as well as diffusion-limited etch-back and slimming techniques.

Referring now to the drawings, wherein like reference numerals designate identical or corresponding parts throughout the several views, FIGS. 1A through 1G, and FIG. 3 illustrate a method for patterning a substrate according to an embodiment. The method is illustrated in a flow chart 300, and begins in 310 receiving a first patterned layer 140 overlying a material layer 130 to be etched on a substrate 110. Substrate 110 may include additional layers, such as second material layer 120. The first patterned layer 140 is composed of a resist material having (i) material properties that provide lithographic resolution of less than about 40 nanometers when exposed to extreme ultraviolet (EUV) radiation lithography, and (ii) material properties that provide a nominal etch resistance to an etch process condition selected to etch the material underlying the first patterned layer 140. In order to simplify the specifications, descriptions of like-referenced numerals designating identical or corresponding parts throughout the several views, for example, material layers common in several figures such as FIG. in 1A to FIG. 1G, shall not be repeated.

The first patterned layer 140 can include a photoresist, such as an EUV resist. For example, the first patterned layer 140 can be a high-speed resist in that the first patterned layer 140 can be fully developed after exposure to less than approximately 10 millijoules of extreme ultraviolet radiation. Although, energy levels in excess of 10 millijoules are acceptable. High-speed resists can yield development speeds that are 5-10 times faster than conventional photoresists. An exemplary high-speed resist is a hafnium oxide-containing photoresist (a resist containing embedded or suspended nanoparticles). In alternative embodiments, the first patterned layer 140 can include a 248 nm (nanometer) resist, a 193 nm resist, a 157 nm resist, an EUV (extreme ultraviolet) resist, or an electron beam sensitive resist. Furthermore, for example, the first patterned layer 140 may comprise a thermal freeze photo-resist, an electromagnetic (EM) radiation freeze photo-resist, or a chemical freeze photo-resist.

The first patterned layer 140 may be formed by spin-coating the material onto substrate 110. The first patterned layer 140 may be formed using a track system. For example, the track system can comprise a Clean Track ACT™ 8, ACT™ 12, LITHIUS™, LITHIUS™ Pro™, or LITHIUS™ Pro VT™ resist coating and developing system commercially available from Tokyo Electron Limited (TEL). Other systems and methods for forming a photo-resist film on a substrate are well known to those skilled in the art of spin-on resist technology. The coating process may be followed by one or more first post-application bakes (PAB) to heat the substrate 110 and one or more cooling cycles, following the one or more first PABs, to cool the substrate 110.

The first patterned layer 140 includes a first pattern 150 that is characterized by features having a height (154)-to-width (152) ratio of less than 1.5-to-1. Alternatively, the height (154)-to-width (152) ratio is less than or equal to 1-to-1. When the aspect ratio exceeds about 1.5 to 2, the probability for pattern collapse is increased.

The first pattern 150 may be formed using a radiation exposure system that includes a dry or wet photo-lithography system. The first pattern 150 may be formed using any suitable conventional stepping lithography system, or scanning lithography system. For example, the photo-lithography system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134). Alternatively, the first pattern 150 may be formed using an electron beam lithography system.

To complete the first pattern 150, the first patterned layer 140 is subjected to a developing process in order to remove the exposed or non-exposed portion of the resist layer (depending on whether a positive-tone or negative-tone resist is utilized), and form the first pattern 150 in the first patterned layer 140. As described above, the first pattern 150 may be characterized by a first critical dimension (CD) or width 152, and height 154. The first pattern 150 may include a first line pattern. The developing process can include exposing the substrate to a developing solution in a developing system, such as a track system. For example, the track system can comprise a Clean Track ACT™ 8, ACT™ 12, LITHIUS™, LITHIUS™ Pro™, or LITHIUS™ Pro V™ resist coating and developing system commercially available from Tokyo Electron Limited (TEL). The developing process may be preceded by one or more first post-exposure bakes (PEB) to heat the substrate 110 and one or more cooling cycles, following the one or more first PEBs, to cool the substrate 110.

Figure 1B:
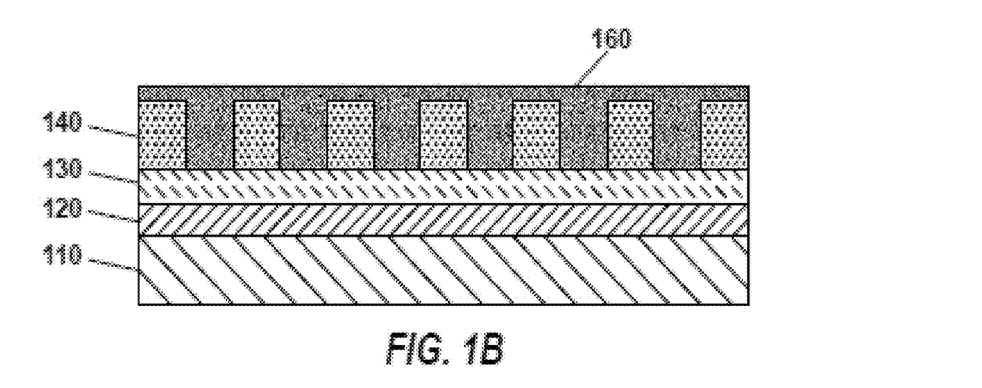
Figure 2A:
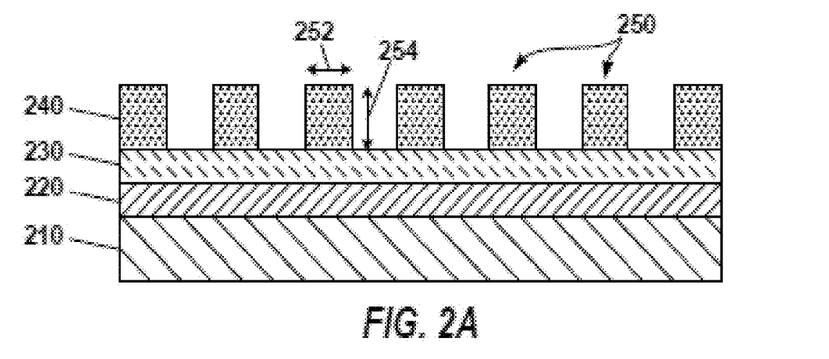
FIGS. 2A through 2F present a simplified schematic representation of a method of patterning a substrate according to another embodiment.

In 314 of FIG. 3 and as shown in FIG. 1B, the substrate 110 having the first patterned layer 140 is over-coated with an image reversal material 160 such that the image reversal material 160 fills and covers the first patterned layer 140, wherein the image reversal material 160 has material properties that provide an etch resistance to the etch process condition that exceeds the nominal etch resistance. For example, the etch process condition for etching underlying material layer 130 may include a $C_xF_y$-based chemistry. The etch resistance of the image reversal material 160 to the $C_xF_y$-based chemistry is greater than the nominal etch resistance (or the etch resistance of the first patterned layer 140 to the etch process condition).

The image reversal material 160 should have high etch resistance/selectivity to the transfer material layer 130. The image reversal material 140 can be organic or inorganic. Furthermore, the image reversal material 160 can be a metal-containing material (e.g., metal particle), a Si-containing material, (e.g., Si-containing ARC (anti-reflective coating, $SiO_x$, $SiN_y$, $SiO_xN_y$, etc.), or a material that demonstrates (hard) cross-linking (i.e., "freezing") at a bake temperature that is not to exceed the resist $T_g$ temperature (glass transition temperature). The metal species, the Si species, or the cross-linking agent can provide the material with the increased etch resistance properties.

The image reversal material 160 may include a thermally curable freeze resist, an EM curable freeze resist, or a chemically curable freeze resist. Such materials include a material that exhibits cross-linking when thermally treated, radiatively treated, or chemically treated. Additionally, the chemical freeze material may include any removable material that may cause cross-linking in a layer of radiation-sensitive material. The chemical freeze material may include a polymeric material. For example, these materials may include materials commercially available from JSR Micro, Inc. (1280 North Mathilda Avenue, Sunnyvale, Calif. 94089), including, for example, FZX F112 freeze material. Alternatively, for example, these materials may include materials commercially available from Rohm and Haas, a wholly owned subsidiary of Dow Chemical Company (100 Independence Mall West, Philadelphia, Pa. 19106), including, for example, SC™ 1000 Surface Curing Agents (SCA).

Further yet, the image reversal material 160 can have a degree of solubility such that a top portion of the image reversal material 160 can be attacked. This overcoat processes can include an etch-back, or stop and fill then etch-back step. For some applications, there are advantages and disadvantages to selecting a develop-back that has some residual solubility, which can depend on whether a wet etch or a dry etch process is subsequently used. Any number of reversal agents can be used for image reversal material 160, such as polymers with a residual develop back capability. In alternative embodiments, oxide films can be used, followed by chemical-mechanical planarization (CMP), or an etch-back using a dry etch.

Even further yet, the image reversal material 160 can be selected to have an inherent solubility and behave similar to a photoresist so that it can be responsive to wet slimming. Alternative embodiments can use a material that does not behave like a resist, and in these embodiments an isotropic etch can be performed to slim and/or etch-back. Thus, in response to selecting a reversal material that has solubility shifting through photo acid diffusion, then wet slimming can be used. In response to using a reversal material that is not sensitive to photo acid (SiARC reversal or developable SiARC material), then a form of dry etching can be used.

Figure 1C:
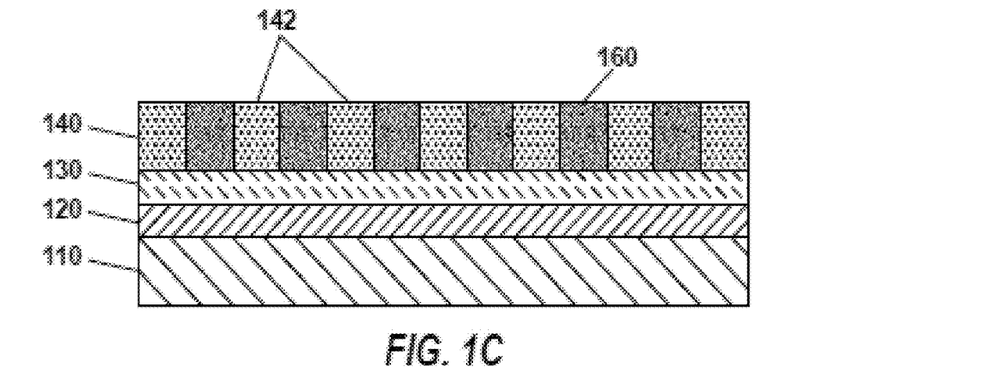

In 316 of FIG. 3 and as shown in FIG. 1C, an upper portion of the image reversal material 160 is removed such that top surfaces 142 of the first patterned layer 140 are exposed. In alternative embodiments, the image reversal material 160 is applied such that the top surfaces 142 remain exposed following the over-coating. As described above, the removal process may include CMP, dry or wet etching, including a vertical slimming process.

In one embodiment, with techniques herein, the substrate 110 can remain in a coater/developer system for the removal/etch-back process. In one embodiment, a diffusion-limited acid down trim of the image reversal material 160 can be executed. A chemical trim overcoat is one example where applied acid diffuses from the top (where applied) down into the film and changes the solubility. After this change in solubility of a top portion of image reversal material 160, the substrate 110 can again be processed by the coater/developer and completed with a wet etch.

One technique as disclosed herein is to coat (or overcoat) the stack with acid for a top-down acid trim back. Top-down acid trim back comprises coating the substrate stack with an acid agent on the top. Then, the stack is baked so that the acid diffuses downwardly into the film, that is, diffuses into a top portion of the image reversal material 160. The result is image reversal material 160 receiving a top-down solubility profile. With the top portion of the image reversal material 160 now being soluble, the film can be washed and developed such that the top portion of the image reversal material 160 is removed. Several parameters can be adjusted to control an amount or depth of the acid diffusion. For example, bake time, concentration of overcoat, molecular weight of the photo acid, bake temp, additional overcoat exposure to drive added acid, type of acid group.

Figure 1D:
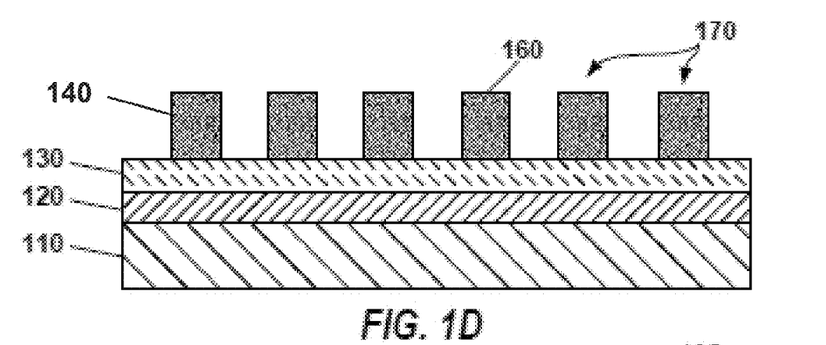

After the top-down trim back, the image reversal material 160 can be set or frozen with a bake. Then, in 318 of FIG. 3 and as shown in FIG. 1D, the first patterned layer 140 can be removed such that the image reversal material 160 remains resulting in a second patterned layer. The removal of the first patterned layer 140 can be performed by a solvent vapor process, a chemical spin coating process, a resist development process, a solvent spin coating process, a dry or wet etch process, etc. With the first patterned layer 140 removed, the result is the second patterned layer 170 having a reversed, second pattern.

Figure 1E:
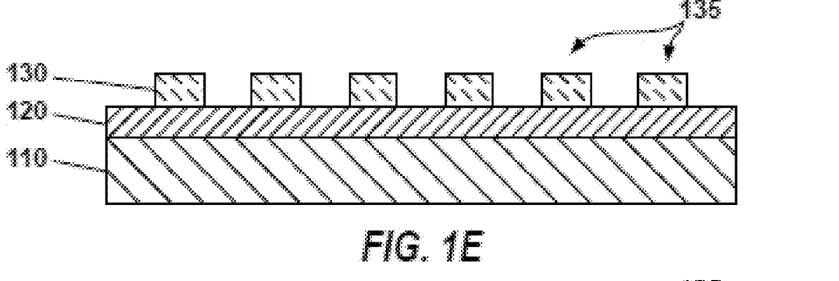

As shown in FIG. 1E, the pattern of the second patterned layer 170 into the material layer 130 using the etch process according to the etch process condition to form material layer pattern 135. The etch process may be a dry or wet etch process. The etch process may be a plasma or non-plasma etch process. The etch process condition is selected to selectively etch the underlying material layer 130 at a rate greater than the rate it etches other materials, including the second patterned layer 170.

Figure 1F:
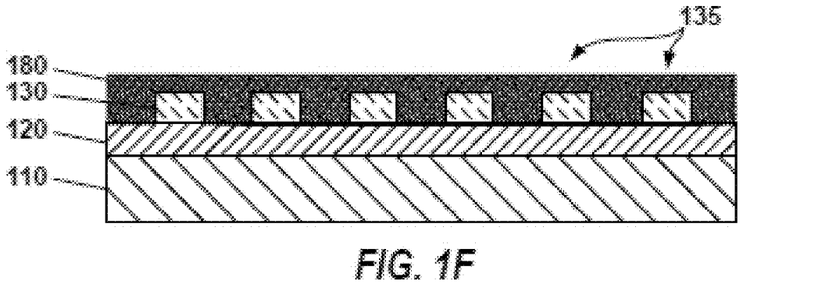

To reverse the second pattern to the first pattern, the patterned, material layer 130 is over-coated with a second image reversal material 180 such that the second image reversal material 180 fills and covers the patterned, material layer 130. As set forth above, the second image reversal material 180 can have material properties that provide an etch resistance to the etch process condition that exceeds the nominal etch resistance. And, as shown in FIG. 1F, an upper portion of the second image reversal material 180 is removed such that top surfaces of the patterned, material layer 130 are exposed.

Figure 1G:
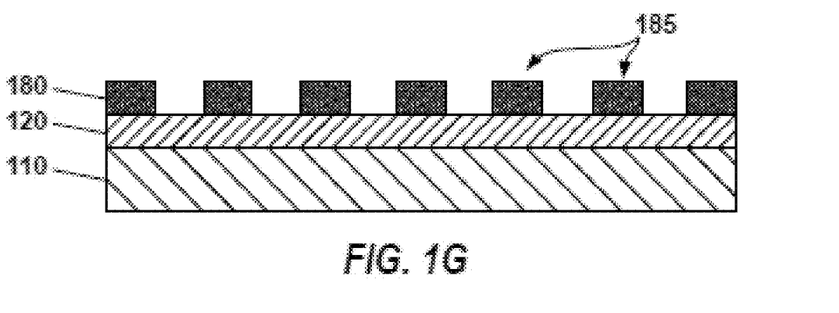

As shown in FIG. 1G, the patterned, material layer 130 is removed such that the second image reversal material 180 remains resulting in a third patterned layer 185.

According to another embodiment, FIGS. 2A through 2E illustrate a method for patterning a substrate. The method includes receiving a first patterned layer 240 overlying a material layer 230 to be etched on a substrate. Substrate 210 may include additional layers, such as underlying material layer 230 and second material layer 220. The first patterned layer 240 is composed of a resist material having (i) material properties that provide lithographic resolution of less than about 40 nanometers when exposed to extreme ultraviolet (EUV) radiation lithography, and (ii) material properties that provide a nominal etch resistance to an etch process condition selected to etch the material underlying the first patterned layer 240. As mentioned above, in order to simplify the specifications, descriptions of like-referenced numerals designating identical or corresponding parts throughout the several views, for example, material layers common in several figures such as FIG. 2A to FIG. 2G, shall not be repeated.

The first patterned layer 240 includes a first pattern 250 that is characterized by features having a height (254)-to-width (252) ratio of less than 1.5-to-1. Alternatively, the height (254)-to-width (252) ratio is less than or equal to 1-to-1. When the aspect ratio exceeds about 1.5 to 2, the probability for pattern collapse is increased.

Figure 2B:
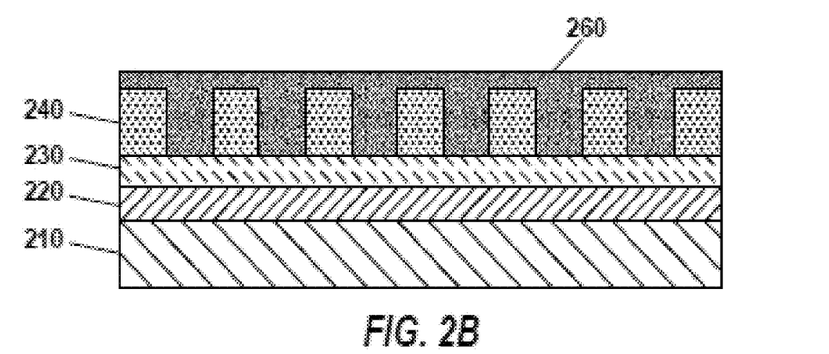
Figure 3:
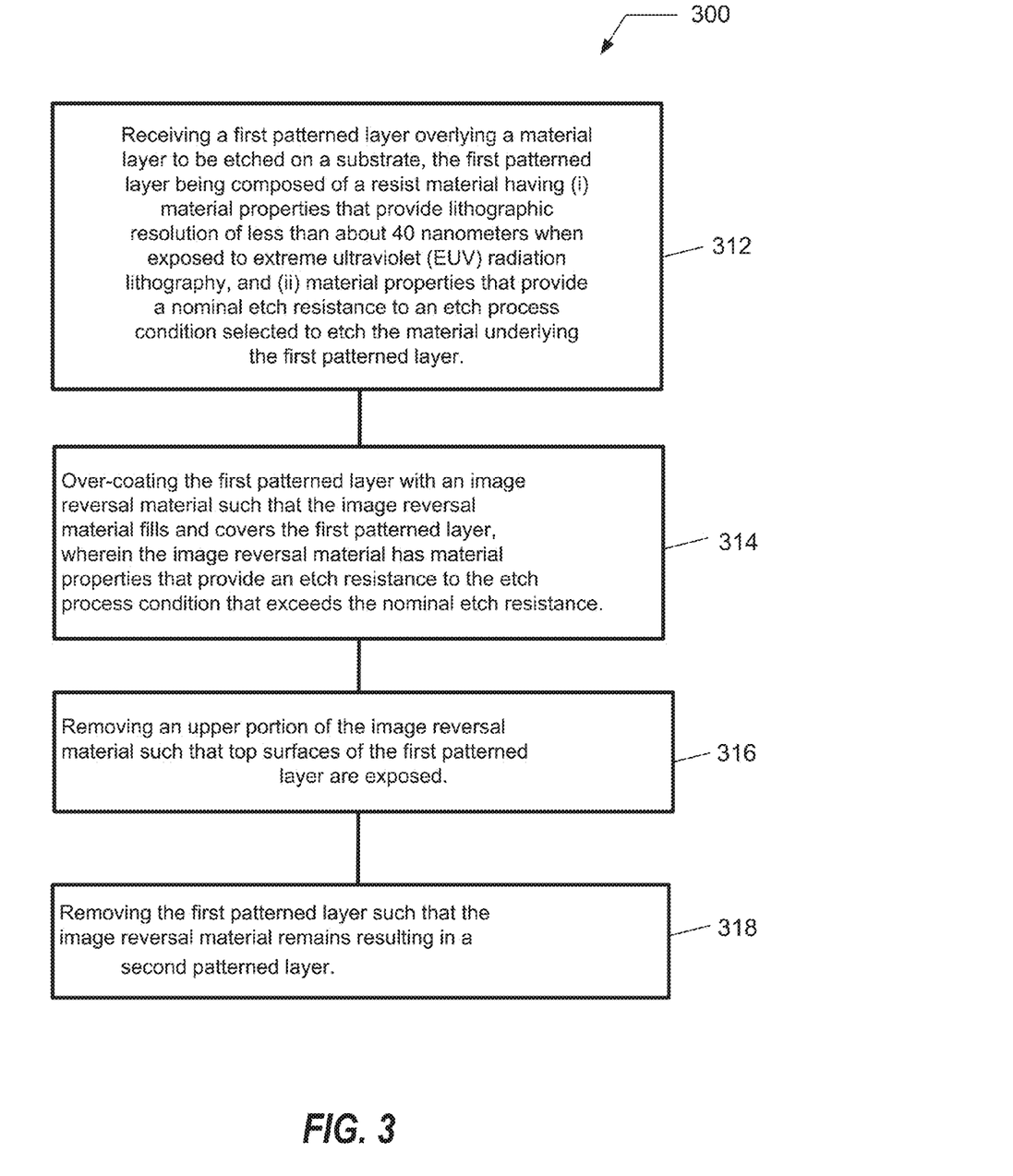
FIG. 3 presents a flow chart describing a method of patterning a substrate according to an embodiment.

As shown in FIG. 2B, the substrate 210 having the first patterned layer 240 is over-coated with an image reversal material 260 such that the image reversal material 260 fills and covers the first patterned layer 240, wherein the image reversal material 260 has material properties that provide an etch resistance to the etch process condition that exceeds the nominal etch resistance.

Figure 2C:
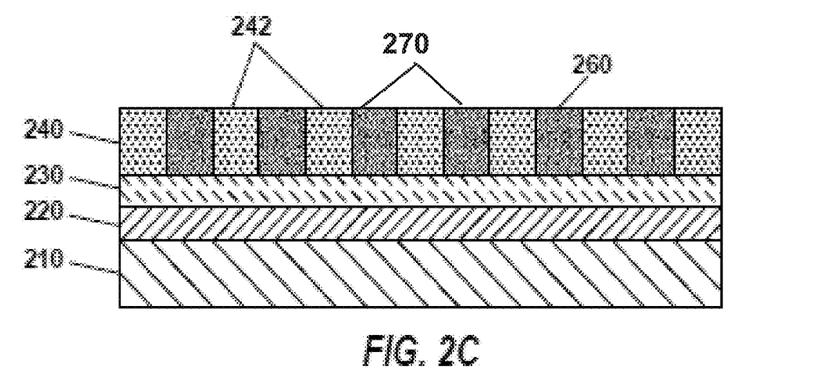

As shown in FIG. 2C, an upper portion of the image reversal material 260 is removed such that top surfaces 242 of the first patterned layer 240 are exposed. In alternative embodiments, the image reversal material 260 is applied such that the top surfaces 242 remain exposed following the over-coating. As described above, the removal process may include CMP, or dry or wet etching, including a vertical slimming process. Then, the first patterned layer 240 is removed such that the image reversal material 260 remains resulting in a second patterned layer 270. With the first patterned layer 240 removed, the result is the second patterned layer 270 having a reversed, second pattern.

Figure 2D:
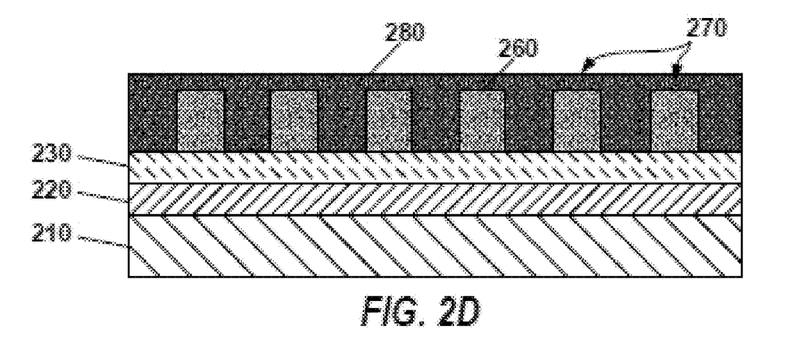

As shown in FIG. 2D, the second patterned layer 270 is over-coated with a second image reversal material 280 such that the second image reversal material 280 fills and covers the second patterned layer 270. The second image reversal material 280 has material properties that provide an etch resistance to the etch process condition that exceeds the nominal etch resistance.

Figure 2E:
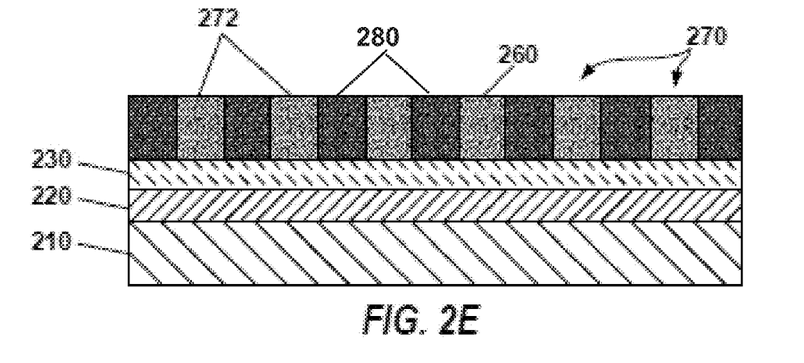
Figure 2F:
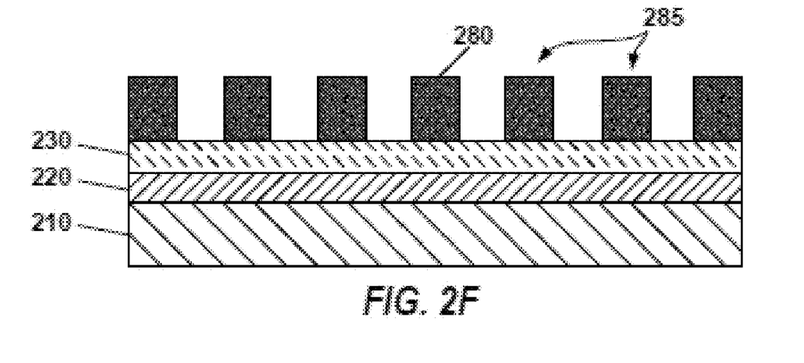

As shown in FIG. 2E, an upper portion of the second image reversal material 280 is removed such that top surfaces 272 of the second patterned layer 270 are exposed. Thereafter, as shown in FIG. 2F, the second patterned layer 270 is removed such that the second image reversal material 280 remains resulting in a third patterned layer 285. Thereafter, the pattern of the third patterned layer 285 can be transferred in to the underlying material layer 230 using the etch process condition.

Figure 4:
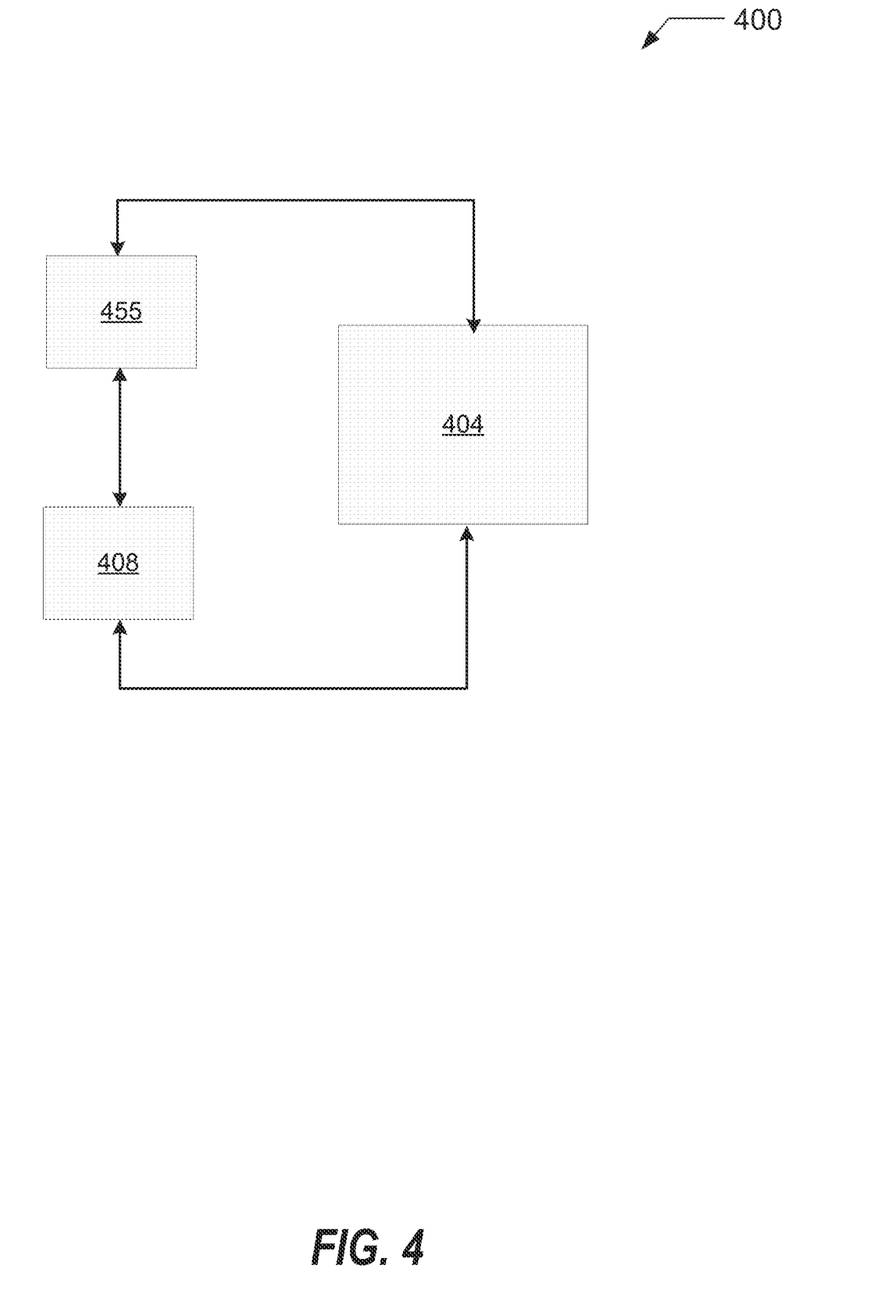
FIG. 4 presents an exemplary systems chart a fabrication system for controlling patterning of substrate according to an embodiment.

FIG. 4 presents an exemplary systems chart 400 of a fabrication system for controlling patterning of a substrate according to an embodiment. The patterning system 404 is coupled to a controller 455 and to a fabrication system 408. The controller 455 can comprise a microprocessor, memory, and a digital I/O port capable of generating control voltages sufficient to communicate and activate inputs to the patterning system 404 and to the fabrication system 408 as well as monitor outputs from fabrication system 408. Moreover, controller 455 can be coupled to and can exchange information with patterning system 404 and subsystems of the fabrication system 408. For example, a program stored in the memory can be utilized to activate the inputs to the aforementioned subsystems of fabrication system 408 and of the patterning system 404 according to a process recipe in order to perform a patterning process on a substrate.

Depending on the applications, additional devices such as sensors or metrology devices can be coupled to the patterning system 404 and to the fabrication system 408 and the controller 455 can collect real time data and use such real time data to concurrently control one or more selected operating variables in two or more steps involving degree of solubility, depth of acid diffusion, aspect ratio, etch chemical flow rate, etch chemical temperature, partial pressure of etch chemicals, and the like in order to achieve patterning objectives. Specifically, the controller 455 coupled to the patterning system 404 can be configured to perform sequences of operations based on instructions stored in a storage device, memory, or based on data communicated by the sensor or by external computer networks.

One or more sensors can be programmed to detect a process endpoint, presence of contaminants or under or over etch or where the degree of solubility or depth of acid diffusion are outside of acceptable ranges, in conjunction with the controller resolve the problem. The fabrication system 408 can include a deposition, a wet or dry etch, cleaning, rinsing, tract, or fluid treatment semiconductor fabrication system. Further, the controller can be configured to utilize selected operating variables which are concurrently controlled to achieve the patterning objectives, the patterning objectives comprising reduced cost of ownership, increased throughput substrates per hour, reduced particle contamination, reduced usage of the processing chemicals and gases, and the like.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

The invention claimed is:

1. A method for patterning a substrate, the method comprising:
   receiving a first patterned layer overlying a material layer to be etched on a substrate, the first patterned layer being composed of a resist material having (i) material properties that provide lithographic resolution of less than about 40 nanometers when exposed to extreme ultraviolet (EUV) radiation lithography, and (ii) material properties that provide a nominal etch resistance to an etch process condition selected to etch the material underlying the first patterned layer, wherein the first patterned layer is characterized by features having a height-to-width ratio of less than 1.5-to-1;
   over-coating the first patterned layer with an image reversal material such that the image reversal material fills and covers the first patterned layer, wherein the image reversal material has material properties that provide an etch resistance to the etch process condition that exceeds the nominal etch resistance;
   removing an upper portion of the image reversal material such that top surfaces of the first patterned layer are exposed; and
   removing the first patterned layer such that the image reversal material remains resulting in a second patterned layer.

2. The method of claim 1, further comprising:
   transferring the pattern of the second patterned layer into the material layer.

3. The method of claim 2, further comprising:
   over-coating the patterned, material layer with a second image reversal material such that the second image reversal material fills and covers the patterned, material layer;
   removing an upper portion of the second image reversal material such that top surfaces of the patterned, material layer are exposed; and
   removing the patterned, material layer such that the second image reversal material remains resulting in a third patterned layer.

4. The method of claim 1, further comprising:
over-coating the second patterned layer with a second image reversal material such that the second image reversal material fills and covers the second patterned layer, wherein the second image reversal material has material properties that provide an etch resistance to the etch process condition that exceeds the nominal etch resistance;
removing an upper portion of the second image reversal material such that top surfaces of the second patterned layer are exposed; and
removing the second patterned layer such that the second image reversal material remains resulting in a third patterned layer.

5. The method of claim 4, further comprising:
transferring the pattern of the third patterned layer into the material layer.

6. The method of claim 1, wherein:
the first patterned layer comprises a high-speed resist, an extreme ultra-violet (EUV) resist, or an electron-beam resist.

7. The method of claim 6, wherein the EUV resist is a high-speed resist.

8. The method of claim 7 wherein the high-speed resist is a hafnium oxide-containing resist.

9. The method of claim 1, wherein:
the first patterned layer comprises a thermal freeze resist, an electromagnetic freeze resist, or a chemical freeze resist.

10. The method of claim 1, wherein:
the image reversal material is an organic or inorganic material.

11. The method of claim 1, wherein:
the image reversal material is a metal-containing material, a silicon-containing material, or a silicon anti-reflective coating (ARC) material.

12. The method of claim 1, wherein:
the image reversal material is a hard-cross linking material.

13. The method of claim 1, wherein:
the over-coating the first patterned layer includes an etch-back step or a stop and fill followed by an etch-back step.

14. The method of claim 13, wherein:
reversal agents for the image reversal material includes polymers with a residual develop-back capability.

15. The method of claim 13, wherein:
the reversal agents for the image reversal material includes oxide films processed with a chemical-mechanical planarization step or followed by an etch-back and a dry etch process.

16. The method of claim 13, wherein:
the image reversal material uses a non-resist material wherein an isotropic etch is performed to slim and etch-back the image reversal material.

17. The method of claim 1, wherein:
over-coating the first patterned layer includes a chemical trim overcoat where applied acid diffuses from a top down and changes solubility of the first patterned layer.

18. The method of claim 17, wherein:
the first patterned layer is baked so that the acid diffuses downwardly, resulting in the image reversal material having a top-down solubility profile.

19. The method of claim 1, wherein:
top surfaces of the first patterned layer are exposed following the overcoating of the first patterned layer.

20. The method of claim 1, wherein:
removing the first patterned layer is performed using a solvent vapor process, a chemical spin coating process, a resist developing process, a solvent spin coating process, a dry etch process or a wet etch process.

21. A method for patterning a substrate, the method comprising:
receiving a first patterned layer overlying a material layer to be etched on a substrate, the first patterned layer being composed of a resist material having (i) material properties that provide lithographic resolution of less than about 40 nanometers when exposed to extreme ultraviolet (EUV) radiation lithography, and (ii) material properties that provide a nominal etch resistance to an etch process condition selected to etch the material underlying the first patterned layer, wherein the first patterned layer is characterized by features having a height-to-width ratio of less than 1.5-to-1;
over-coating the first patterned layer with an image reversal material such that the image reversal material fills and covers the first patterned layer, wherein the image reversal material has material properties that provide an etch resistance to the etch process condition that exceeds the nominal etch resistance;
removing an upper portion of the image reversal material such that top surfaces of the first patterned layer are exposed;
removing the first patterned layer such that the image reversal material remains resulting in a second patterned layer; and
controlling one or more selected operating variables which are concurrently controlled during one or more operations including over-coating the first patterned layer with the image reversal material, removing the upper portion of the image reversal material, and/or removing the first patterned layer such that the image reversal material remains results in a second patterned layer, the controlling done in order to achieve patterning objectives.

* * * * *

UNITED STATES PATENT AND TRADEMARK OFFICE
CERTIFICATE OF CORRECTION

PATENT NO. : 9,791,779 B2
APPLICATION NO. : 14/882626
DATED : October 17, 2017
INVENTOR(S) : Lior Huli It is certified that error appears in the above-identified patent and that said Letters Patent is hereby corrected as shown below:

On the Title Page

On Page 2, Column 2, Line 13, "US; AZ Electroni Materials," should read --US; AZ Electronic Materials,--.

In the Specification

In Column 2, Line 26, "FIG. 4 presents an exemplary systems chart a fabrication" should read --FIG. 4 presents an exemplary systems chart of a fabrication--.

In Column 4, Line 6, "Pro VT™ resist coating" should read --Pro V™ resist coating--.

In Column 5, Lines 28-29, "This overcoat processes can include" should read --This overcoat process can include--.

In Column 6, Line 28, "layer 170 into the material layer" should read --layer 170 is transferred into a material layer--.

In Column 8, Line 8, "ranges, in conjunction" should read --ranges, and in conjunction--.

In the Claims

In Column 9, Line 40, Claim 12, "the image reversal material is a hard-cross linking" should read --the image reversal material is a hard cross-linking--.

In Column 9, Line 47, Claim 14, "the image reversal material includes" should read --the image reversal material include--.

Signed and Sealed this
Twentieth Day of February, 2018

Andrei Iancu
*Director of the United States Patent and Trademark Office*

CERTIFICATE OF CORRECTION (continued)
U.S. Pat. No. 9,791,779 B2

In Column 9, Lines 50-51, Claim 15, "the image reversal material includes" should read --the image reversal material include--.

In Column 10, Line 50, Claim 21, "reversal material remains results" should read --reversal material remains result--.